United States Patent
Vuillermet et al.

(10) Patent No.: US 11,047,928 B2
(45) Date of Patent: Jun. 29, 2021

(54) METHODS AND APPARATUS FOR FREQUENCY EFFECT COMPENSATION IN MAGNETIC FIELD CURRENT SENSORS

(71) Applicant: Allegro MicroSystems, LLC, Manchester, NH (US)

(72) Inventors: Yannick Vuillermet, Voglans (FR); Loïc André Messier, Vanzy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 16/511,101

(22) Filed: Jul. 15, 2019

(65) Prior Publication Data
US 2021/0018573 A1     Jan. 21, 2021

(51) Int. Cl.
*G01R 33/00* (2006.01)
*G01R 15/20* (2006.01)

(52) U.S. Cl.
CPC ....... *G01R 33/0017* (2013.01); *G01R 15/202* (2013.01); *G01R 15/205* (2013.01); *G01R 33/0005* (2013.01)

(58) Field of Classification Search
CPC .............. G01R 33/0017; G01R 33/005; G01R 15/20–205
See application file for complete search history.

(56) References Cited

U.S. PATENT DOCUMENTS

| | | | |
|---|---|---|---|
| 6,583,613 B1 * | 6/2003 | Hohe | G01R 15/20 324/117 R |
| 7,259,545 B2 | 8/2007 | Stauth et al. | |
| 7,598,601 B2 | 10/2009 | Taylor et al. | |

(Continued)

FOREIGN PATENT DOCUMENTS

| | | |
|---|---|---|
| EP | 3255441 A1 | 12/2017 |
| JP | H 02236174 | 9/1990 |

(Continued)

OTHER PUBLICATIONS

U.S. Appl. No. 15/999,122, filed Aug. 17, 2018, Vuillermet et al.

(Continued)

*Primary Examiner* — Patrick Assouad
*Assistant Examiner* — Demetrius R Pretlow
(74) *Attorney, Agent, or Firm* — Daly, Crowley, Mofford & Durkee, LLP

(57) ABSTRACT

A current sensor is provided with one or more magnetic field sensing elements configured to generate a magnetic field signal indicative of a magnitude of a sensed magnetic field, wherein the sensed magnetic field is related to a magnitude and frequency of a current through a conductor. A signal path is responsive to the magnetic field signal and includes a compensator configured to apply a compensation factor to the magnetic field signal to generate a sensor output signal indicative of the magnitude of the current and substantially independent of a frequency of the current. The sensed magnetic field is related to the magnitude of the current by a coupling factor and the signal path is responsive to a characterization of the coupling factor over a range of frequencies of the current in order to determine the compensation factor to be applied.

23 Claims, 9 Drawing Sheets

(56) References Cited

U.S. PATENT DOCUMENTS

| 7,923,996 | B2 | 4/2011 | Doogue et al. |
| 8,080,994 | B2 | 12/2011 | Taylor et al. |
| 8,269,491 | B2 | 9/2012 | Cummings et al. |
| 10,641,802 | B2* | 5/2020 | Petrie .................. G01R 19/252 |
| 2008/0205557 | A1 | 8/2008 | He |
| 2011/0121827 | A1* | 5/2011 | Yakymyshyn ....... G01R 15/207 |
| | | | 324/251 |
| 2011/0224937 | A1* | 9/2011 | Nishimura ............. H02P 27/06 |
| | | | 702/106 |
| 2011/0227560 | A1* | 9/2011 | Haratani ............. G01R 33/093 |
| | | | 324/117 R |
| 2011/0234215 | A1* | 9/2011 | Ausserlechner ... G01R 33/0047 |
| | | | 324/244 |
| 2013/0082698 | A1* | 4/2013 | Fukui .................. G01R 15/205 |
| | | | 324/252 |
| 2013/0162245 | A1* | 6/2013 | Tamura ................. G01R 33/07 |
| | | | 324/225 |
| 2013/0241529 | A1* | 9/2013 | El-Essawy ............. G01R 35/04 |
| | | | 324/74 |
| 2014/0184212 | A1* | 7/2014 | Yamaguchi .......... G01R 15/207 |
| | | | 324/244 |
| 2015/0219692 | A1* | 8/2015 | Krah .................... G01R 15/207 |
| | | | 324/117 H |
| 2016/0223594 | A1* | 8/2016 | Suzuki .................. G01R 15/20 |
| 2017/0370969 | A1* | 12/2017 | Okuyama ............ G01R 15/205 |
| 2018/0017656 | A1* | 1/2018 | Kato ....................... G01R 15/20 |
| 2018/0238933 | A1* | 8/2018 | Lachman ............... G01R 21/06 |
| 2018/0238938 | A1 | 8/2018 | Feucht et al. |
| 2018/0306843 | A1 | 10/2018 | Bussing et al. |
| 2018/0321283 | A1* | 11/2018 | Sei ........................... H01F 3/14 |
| 2019/0025346 | A1 | 1/2019 | Latham |
| 2019/0242930 | A1* | 8/2019 | Hisanaga ........... G01R 19/2513 |
| 2019/0317135 | A1* | 10/2019 | Guillot .................. G01R 33/04 |
| 2020/0033384 | A1* | 1/2020 | Kishi .................... G01R 15/20 |
| 2020/0099286 | A1* | 3/2020 | Maeda ................. H02M 7/5387 |
| 2020/0191835 | A1* | 6/2020 | Bilbao De Mendizabal ............... |
| | | | G01R 33/091 |
| 2020/0256895 | A1* | 8/2020 | Okuyama ............ G01R 15/148 |
| 2020/0300894 | A1* | 9/2020 | Brusius ............... G01R 19/0092 |

FOREIGN PATENT DOCUMENTS

| JP | 2009243892 | 10/2009 |
| JP | 2014115114 | 6/2014 |
| WO | WO 2008/030129 | 3/2008 |

OTHER PUBLICATIONS

Extended European Search Report dated Dec. 14, 2020 European Application No. 20183068.4; 8 pages.

* cited by examiner

METHODS AND APPARATUS FOR FREQUENCY EFFECT COMPENSATION IN MAGNETIC FIELD CURRENT SENSORS

CROSS-REFERENCE TO RELATED APPLICATIONS

Not Applicable.

STATEMENT REGARDING FEDERALLY SPONSORED RESEARCH

Not Applicable.

FIELD

This disclosure relates generally to magnetic field current sensors, and, more particularly, to magnetic field current sensors having frequency effect compensation.

BACKGROUND

Some conventional current sensors are positioned near a current-carrying conductor to sense a magnetic field generated by the current through the conductor. The current sensor generates an output signal having a magnitude proportional to the magnetic field induced by the current through the conductor and thus, indicative of the current through the conductor.

The accuracy with which a magnetic field current sensor senses an intended current can be affected by the frequency of a varying current through the conductor. In particular, a varying current (even of fixed magnitude) generates a varying magnetic field and a varying magnetic field tends to generate eddy currents. Eddy currents can alter the current density distribution in the conductor, thereby modifying the magnetic field distribution as compared to the field distribution associated with a DC current, and also modifying the measured magnetic field and the accuracy of the current measurement. As a result, conventional magnetic field current sensors tend to have a specified current frequency range of operation.

SUMMARY

The present disclosure provides a current sensor operable to accurately sense current over a wide range of current frequencies. A coupling factor between the sensor and the conductor is characterized over the range of frequencies and is used to compensate for the effect of the current frequency.

In accordance with the disclosure, a current sensor having one or more magnetic field sensing elements configured to generate a magnetic field signal indicative of a magnitude of a sensed magnetic field, wherein the sensed magnetic field is related to a magnitude and frequency of a current through a conductor. A signal path is responsive to the magnetic field signal and includes a compensator configured to apply a compensation factor to the magnetic field signal to generate a sensor output signal indicative of the magnitude of the current and substantially independent of a frequency of the current. The sensed magnetic field is related to the magnitude of the current by a coupling factor and the signal path is responsive to a characterization of the coupling factor over a range of frequencies of the current in order to determine the compensation factor to be applied.

The magnetic field sensor may include one or more of the following features alone or in combination. The characterization of the coupling factor may be generated based on one or both of simulating operation of the current sensor or testing of the current sensor. In embodiments, the current sensor may include a frequency measurement circuit to measure the frequency of the current. A look-up table may be provided in which the characterization of the coupling factor is stored. The signal path may include a processor and the compensation factor may be determined by the processor using the look-up table in response to the measured frequency of the current. A memory may be configured to store an approximating function of the characterization of the coupling factor. The signal path may include a processor and the compensation factor may be determined by the processor computing the approximating function in response to the measured frequency. In embodiments, the signal path may include a filter having an inverse frequency response with respect to a transfer function of the coupling factor.

The magnetic field sensing elements and the signal path may be integrated into a package and the conductor may be integrated into the same package. The magnetic field sensing elements and the signal path may be integrated into a package and the conductor may be external to the package. The magnetic field sensing elements may include one or more of magnetoresistance elements, Hall effect elements, or fluxgate element. The magnetoresistance elements may include at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element. In embodiments, at least one first magnetic field sensing element is spaced from at least one second magnetic field sensing element, the at least one first magnetic field sensing element is configured to generate at least one first magnetic field signal indicative of a distance between the at least one first magnetic field sensing element and the conductor and at least one second magnetic field sensing element is configured to generate at least one second magnetic field signal indicative of a distance between the at least one second magnetic field sensing element and the conductor and the signal path includes a circuit responsive to the at least one first magnetic field signal and to the at least one second magnetic field signal and configured to generate a difference signal indicative of a difference between the at least one first magnetic field signal and the at least one second magnetic field signal, wherein the difference is indicative of the magnitude of the current and substantially independent of the frequency of the current.

In another aspect, a method for sensing a current through a conductor includes generating a magnetic field signal in response to a magnetic field associated with the current and applying a compensation factor to the magnetic field signal to generate a sensor output signal indicative of the magnitude of the current and substantially independent of a frequency of the current. The sensed magnetic field is related to the magnitude of the current by a coupling factor and the method may further include characterizing the coupling factor over a range of frequencies of the current and determining the compensation factor based on the characterization of the coupling factor.

Features of the method may include one or more of the following alone or in combination. In embodiments, the method may further include measuring a frequency of the current and using the measured frequency to determine the compensation factor to be applied to the magnetic field signal. In embodiments, applying the compensation factor to the magnetic field signal may include filtering the magnetic field signal with a filter having an inverse transfer function with respect to a transfer function of the coupling factor.

According to a further aspect, a current sensor includes means for sensing a magnetic field generated by a current through a conductor and generating a magnetic field signal related to a magnitude and frequency of the current and means for applying a compensation factor to the magnetic field signal to generate a sensor output signal indicative of the magnitude of the current and substantially independent of a frequency of the current. The sensed magnetic field is related to the magnitude of the current by a coupling factor and the current sensor may further include means for characterizing the coupling factor over a range of frequencies of the current in order to determine the compensation factor. In embodiments, the current sensor may further include means for measuring the frequency of the current and using the measured frequency to determine the compensation factor. In embodiments, the compensation factor applying means may include a filter having a transfer function inversely related to a transfer function of the coupling factor.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

The features and other details of the disclosure will now be more particularly described. It will be understood that any specific embodiments described herein are shown by way of illustration and not as limitations of the concepts, systems and techniques described herein. The principal features of this disclosure can be employed in various embodiments without departing from the scope of the concepts sought to be protected.

Figure 1:
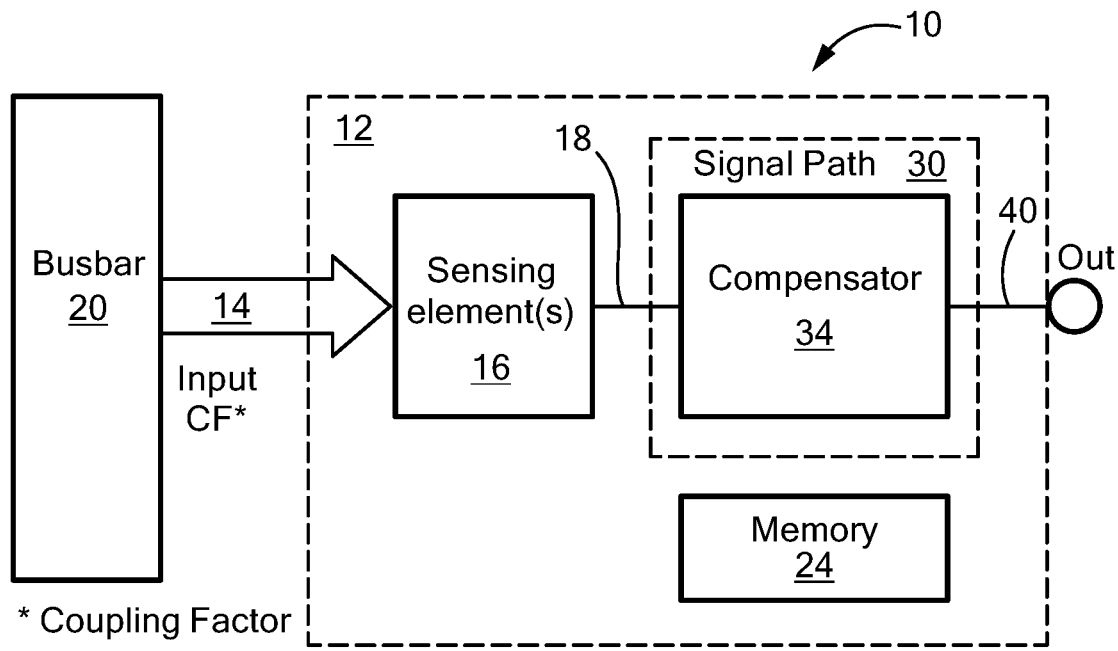
FIG. 1 is a simplified block diagram of an example magnetic field current sensor according to the disclosure.

Referring to FIG. 1, a magnetic field current sensor system 10 includes a current sensor 12 and a conductor 20 configured to carry a current for sensing by the current sensor. The current through the conductor 20 generates a magnetic field sensed by the current sensor 12. The current sensor 12 includes one or more magnetic field sensing elements 16 configured to generate a magnetic field signal 18 indicative of a magnitude of a sensed magnetic field. A signal path 30 is responsive to the magnetic field signal 18 and includes a compensator 34 configured to apply a compensation factor to the magnetic field signal to generate a sensor output signal 40 indicative of the magnitude of the current and substantially independent of a frequency of the current.

As used herein, the term "magnetic field sensing element" (e.g., the one or more magnetic field sensing elements 16) is used to describe a variety of electronic elements that can sense a magnetic field. The magnetic field sensing element can be, but is not limited to, a Hall effect element, a magnetoresistance element, a magnetotransistor, or a fluxgate element. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Various configurations and features of the current sensor 12 are shown and described below in connection with FIGS. 4 and 5. Suffice it to say here that the current sensor 12 can be a linear or differential sensor.

Conductor 20 can be an integral conductor (e.g., integrated into a common package, such as an integrated circuit package, with the current sensor 12). Alternatively, the conductor can be an external conductor (e.g., positioned external to the current sensor package but proximal to the package). Example external conductors can take various forms, such as a printed circuit board conductor or a busbar, as examples.

The magnetic field sensed by the sensing element(s) 16 is related to the magnitude of the current I through the conductor by a coupling factor CF (shown pictorially by an arrow labeled 14). The coupling factor 14 refers to the relationship between the magnitude of the current I and the resulting magnetic field H around the conductor and can be expressed by α in the following equation (1):

$$H(f, I) = \alpha(f) \times I \quad (1)$$

where I is the current through the conductor 20 and $f$ is the frequency of the current I. At DC, α is constant over current magnitude. However, the coupling factor a varies with frequency of the current. Hence, knowing the DC coupling factor (i.e, α(0)) and measuring the field H is not enough to accurately measure the current over frequency.

According to the disclosure, the coupling factor α 14 is characterized over a range of frequencies of the current I through the conductor 20 in order to thereby generate information about the frequency effects on current measurement. This characterization is used to determine a compensation factor to be applied by the compensator 34.

Figure 2:
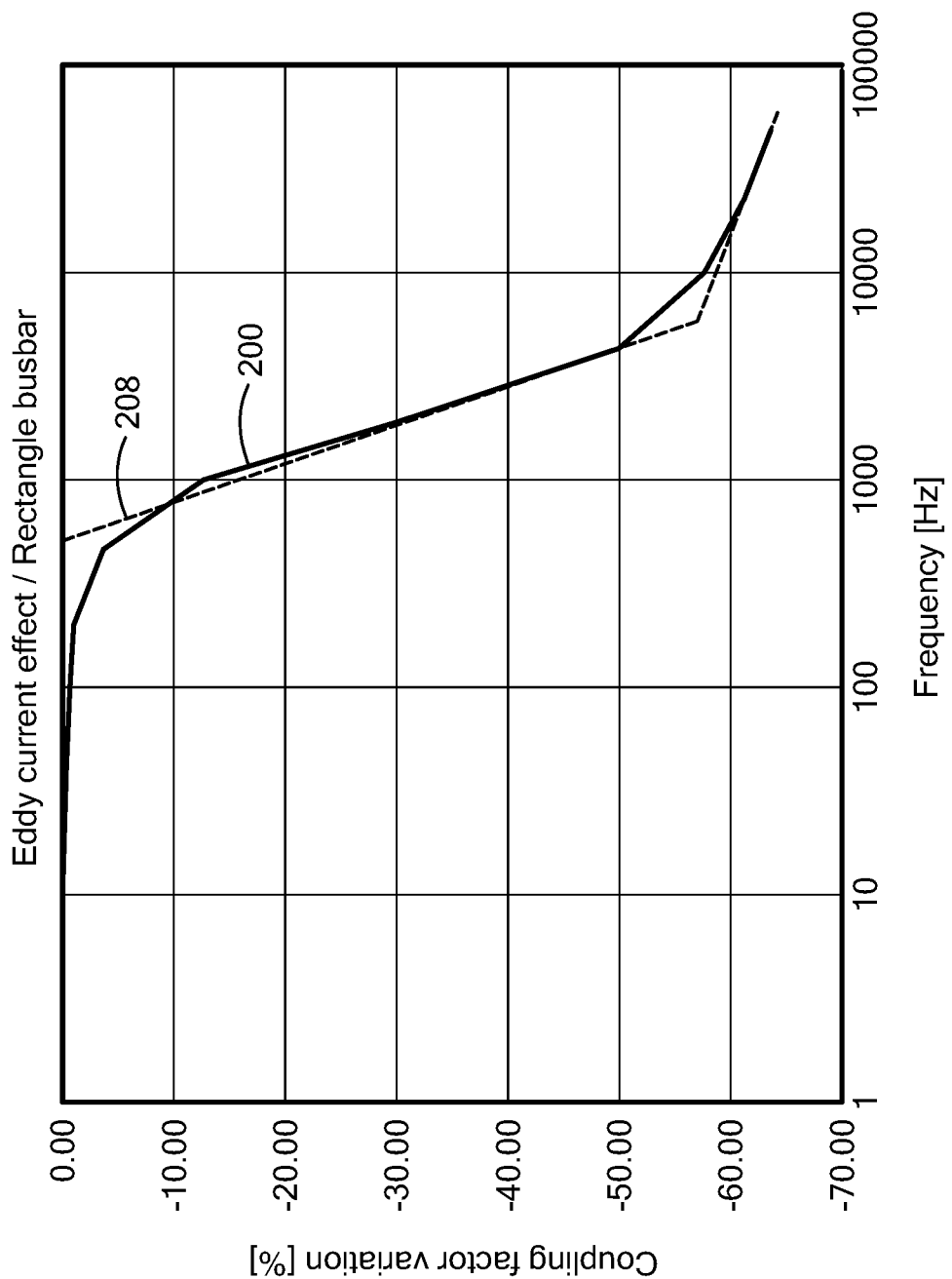
FIG. 2 is a graph illustrating a coupling factor variation between current and magnetic field over frequency for an example current sensor with the variation in the coupling factor shown in percentage.

Referring also to FIG. 2, a characterization of the coupling factor α 14 for an example rectangular bus bar conductor is shown in a plot 200 having a horizontal axis representing the frequency of the current I with a scale in units of Hertz and a vertical axis representing the variation of the coupling factor α 14 with a scale in units of percentage variation. Also shown in FIG. 2, is a coupling factor characterization 208 that can be determined by an approximating function.

The coupling factor α 14 can be affected by various factors including, but not limited to placement of the sensing elements 16 relative to the conductor 20, the conductor shape, material and dimensions. Therefore, busbar and sensor placement can be optimized to obtain different frequency response.

Various techniques are possible to generate the coupling factor characterization. For example, the coupling factor α 14 can be characterized by simulating operation of the current sensor 12 and/or by testing the current sensor operation, for example in a manufacturing setting.

In embodiments, the coupling factor characterization can be stored, for example in a memory (e.g., EEPROM) 24 internal or external to the current sensor 12. In some embodiments, the characterization is stored in memory in the form of a look-up table containing a plurality of coupling factor values, each associated with a corresponding current frequency. Alternatively, in some embodiments, the characterization is stored in the form of an approximating function that is used to compute the coupling factor based a mathematical function that characterizes a relationship between the current frequency and the generated field.

Figure 1A:
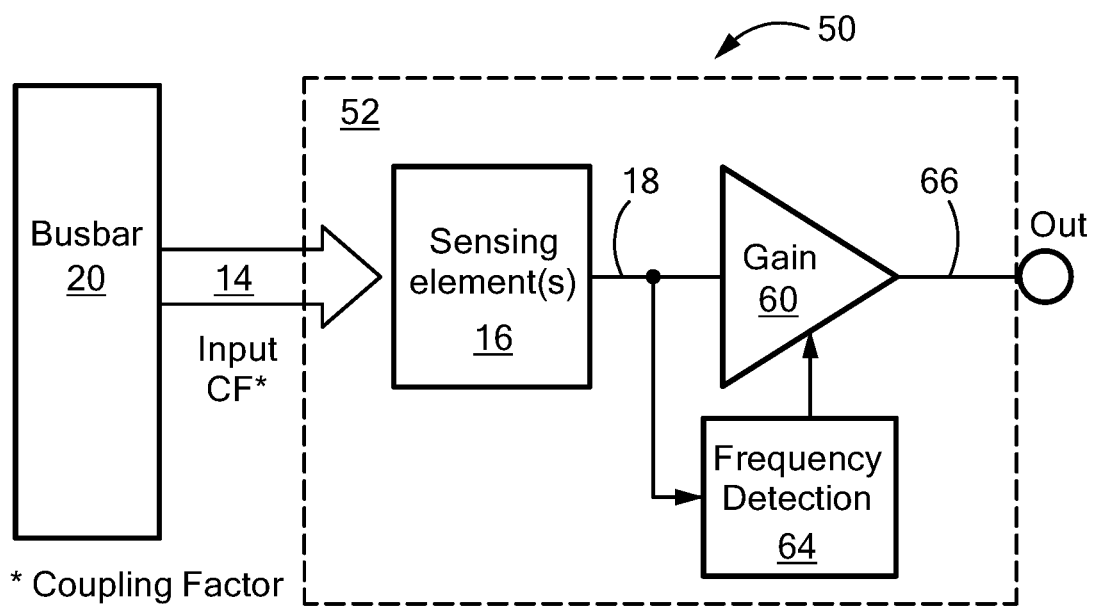
FIG. 1A is a simplified block diagram of an embodiment of the current sensor of FIG. 1.

Referring also to FIG. 1A, a current sensor system 50 includes a current sensor 52 and conductor 20 configured to carry a current for sensing by the current sensor. Current sensor 52 represents an embodiment of the current sensor 12 of FIG. 1 and includes one or more magnetic field sensing elements 16 configured to generate a magnetic field signal 18 indicative of a magnitude of a sensed magnetic field.

The signal path of current sensor 52 includes a compensator in the form of a gain element 60 by which the compensation factor can be applied to the magnetic field signal 18 to generate a sensor output signal 66 indicative of the magnitude of the current and substantially independent of a frequency of the current. The gain element 60 can be implemented in the analog and/or digital domain. In some embodiments, the gain element 60 can be an amplifier circuit. In some embodiments, the gain element 60 can be implemented with a processor.

As used herein, the term "processor" (e.g., a processor implementation of gain element 60) is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied, for example, in a specially programmed microprocessor, a digital signal processor (DSP), or an application specific integrated circuit (ASIC), which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also be embodied in a microprocessor with associated program memory. Furthermore, in some embodiments the "processor" can be embodied in a discrete electronic circuit, which can be an analog circuit, a digital circuit or a combination of an analog circuit and a digital circuit. The "controller" described herein may be provided as a "processor."

Current sensor 52 includes a frequency detector 64 coupled to receive the magnetic field signal 18 and configured to measure the frequency of the current through the conductor 20. The measured frequency (represented by reference character 62) can be used along with the coupling factor characterization (as may be stored in memory) by the element 60 (as may be a processor) to determine the compensation factor to be applied to the magnetic field signal 18 in order to thereby generate the sensor output signal 66 by cancelling the effect of the current frequency so that the output signal 66 is indicative of the current magnitude and independent of the current frequency.

Various circuitry and techniques are suitable for measuring the current frequency. By way of non-limiting examples, the frequency detector 64 can be provided as a circuit configured to measure the time between two consecutive like peaks of the magnetic field signal 18 (e.g., to measure a time between consecutive positive peaks of the magnetic field signal or to measure a time between consecutive negative peaks of the magnetic field signal) or to measure the time between two consecutive like crossings of a predetermined threshold level (e.g., to measure a time between the consecutive positive going, or rising signal crossings of a threshold at a percentage of the peak-to-peak magnetic field signal). Another example frequency detector 64 can utilize a frequency-to-voltage (F/V) converter circuit to provide voltage input proportional to signal frequency within the device.

It will be appreciated that the sensor output signal 66 is related to the measured magnetic field H by constant k and further, that when the current to be measured is a varying current, the output signal 66 can be represented as follows:

$$V_{OUT}(f, I) = k(f) \cdot H(f, I) \quad (2)$$

where the output signal $V_{OUT}$ 66 and the magnetic field H are both functions of the frequency $f$ of the current and the magnitude of the current I and the constant k is likewise a function of the current frequency. The compensation factor to be applied to the magnetic field signal 18 in order to generate a sensor output signal that is indicative of the current magnitude and independent of the current frequency is given by the term k(f) in equation (2).

The variation of the coupling factor a over frequency (as shown for example in FIG. 2) can be expressed as Δα(f) according to the following equation (3):

$$\Delta\alpha(f) = 100 \times \frac{\alpha(f) - \alpha(0)}{\alpha(0)}. \quad (3)$$

Figure 2A:
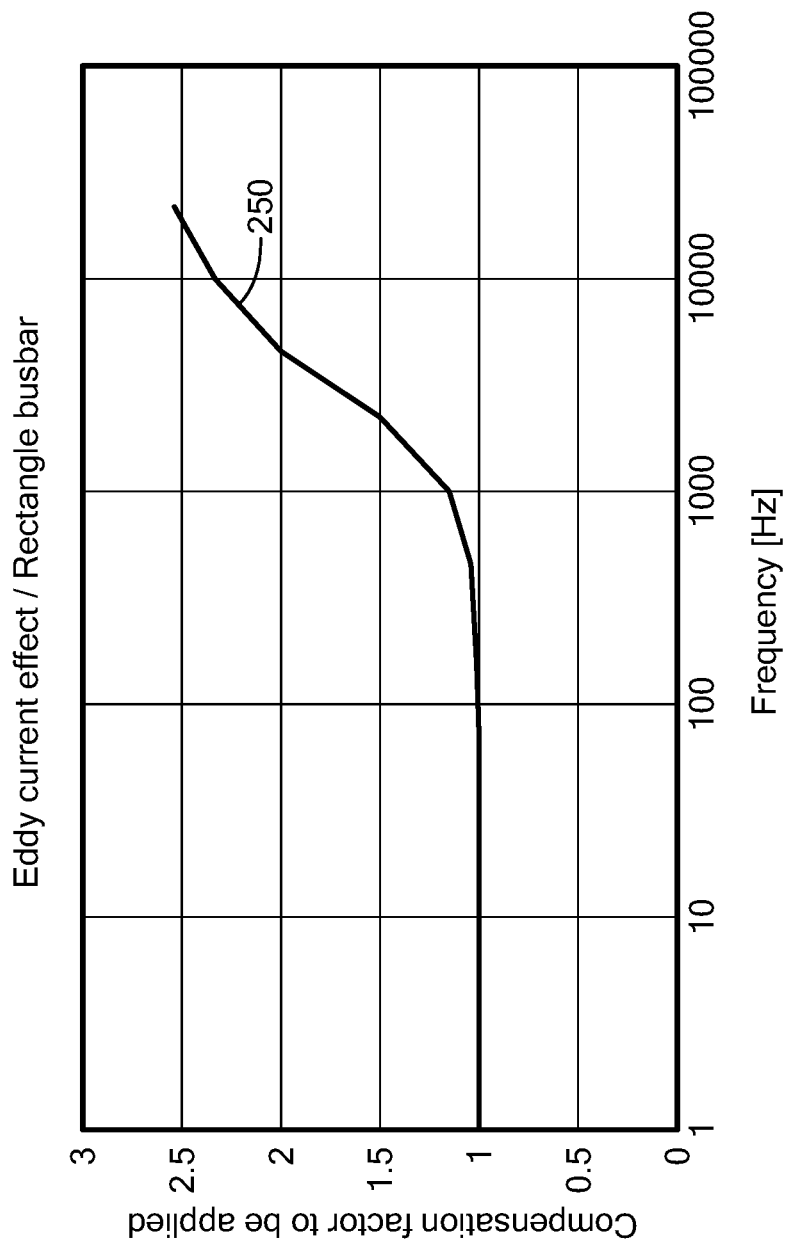
FIG. 2A is a graph illustrating a compensation factor for the example current sensor characterized by FIG. 2.

In order to compensate for the effect of frequency of the current, the compensation factor to be applied, k(f) should have an inverse relationship with respect to the coupling factor so as to linearize the native coupling factor frequency response. For example, in order to compensate for the example coupling factor variation shown in FIG. 2, a compensation factor k(f) having an inverse characteristic with respect to FIG. 2 should be applied. Such a compensation factor k(f) is illustrated by the plot 250 shown in FIG. 2A having a horizontal axis representing the frequency of the current I with a scale in units of Hertz and a vertical axis representing the compensation factor with a scale in arbitrary units.

The compensation factor k(f) can be determined according to equation (4):

$$k(f) = \frac{G}{1 + \frac{\Delta\alpha(f)}{100}} \quad (4)$$

where $f$ is the frequency of the current, G represents the gain of the sensor signal path, and $\Delta\alpha$ is the variation of the coupling factor a over frequency in percent.

By applying the compensation factor k(f) to the magnetic field signal 18, the sensor output signal 66 can be expressed as follows:

$$V_{OUT}(I) = G \cdot \alpha(0) \cdot I \quad (5)$$

As will be appreciated from consideration of equation (5), the resulting sensor output signal 66 is independent of the current frequency, as is desired. Thus, by determining and applying the compensation factor k(f), dependence of the sensor output signal 66 on the frequency of the current can be eliminated.

Figure 1B:
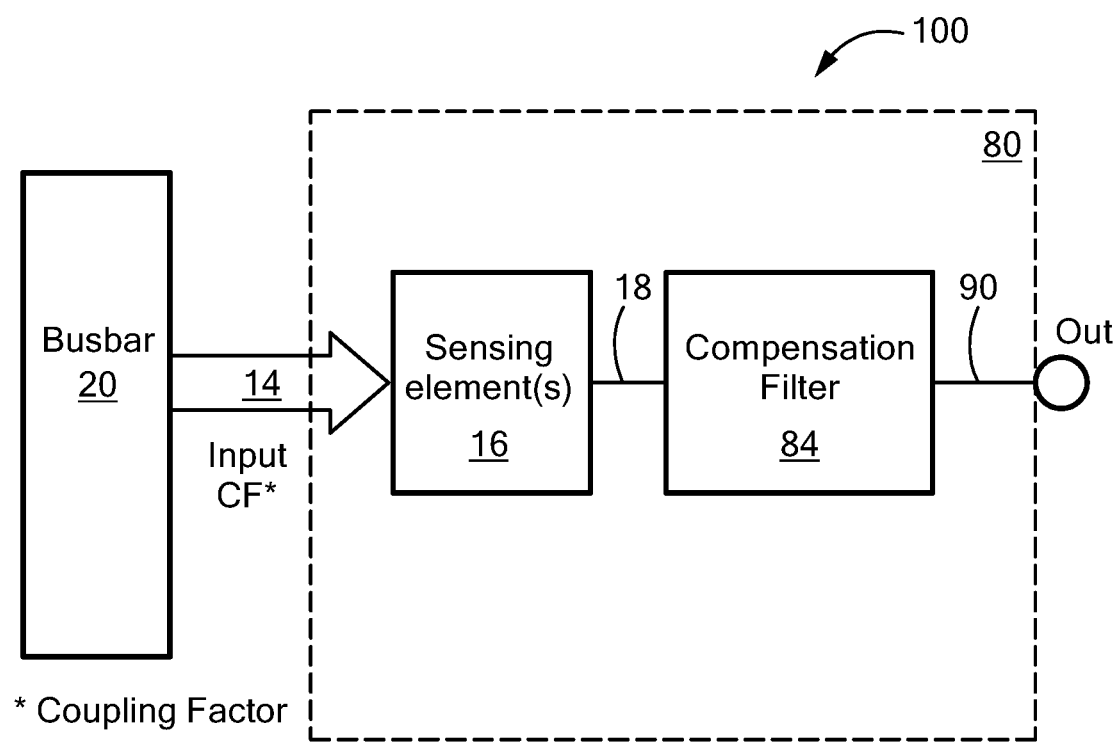
FIG. 1B is a simplified block diagram of another embodiment of the current sensor of FIG. 1.

Referring also to FIG. 1B, another current sensor system 100 includes a current sensor 80 and conductor 20 configured to carry a current for sensing by the current sensor. Current sensor 80 represents another embodiment of the current sensor 12 of FIG. 1 and includes one or more magnetic field sensing elements 16 configured to generate a magnetic field signal 18 indicative of a magnitude of a sensed magnetic field.

The signal path of current sensor 80 includes a compensator in the form of a filter 84 by which the compensation factor can be applied to the magnetic field signal 18 to generate a sensor output signal 90 indicative of the magnitude of the current and substantially independent of a frequency of the current. The current sensor 80 does not require detection of the current frequency. As will be explained, filter 84 can be designed to have an opposite, or inverse transfer function with respect to the coupling factor so as to "cancel" the effects of the coupling factor transfer function.

Although shown as a single filter 84, it will be appreciated that more than one filter can be used to apply the compensation factor. It will also be appreciated that the filter 84 can be an analog or digital filter, FIR or IIR, depending on application requirements.

Figure 3:
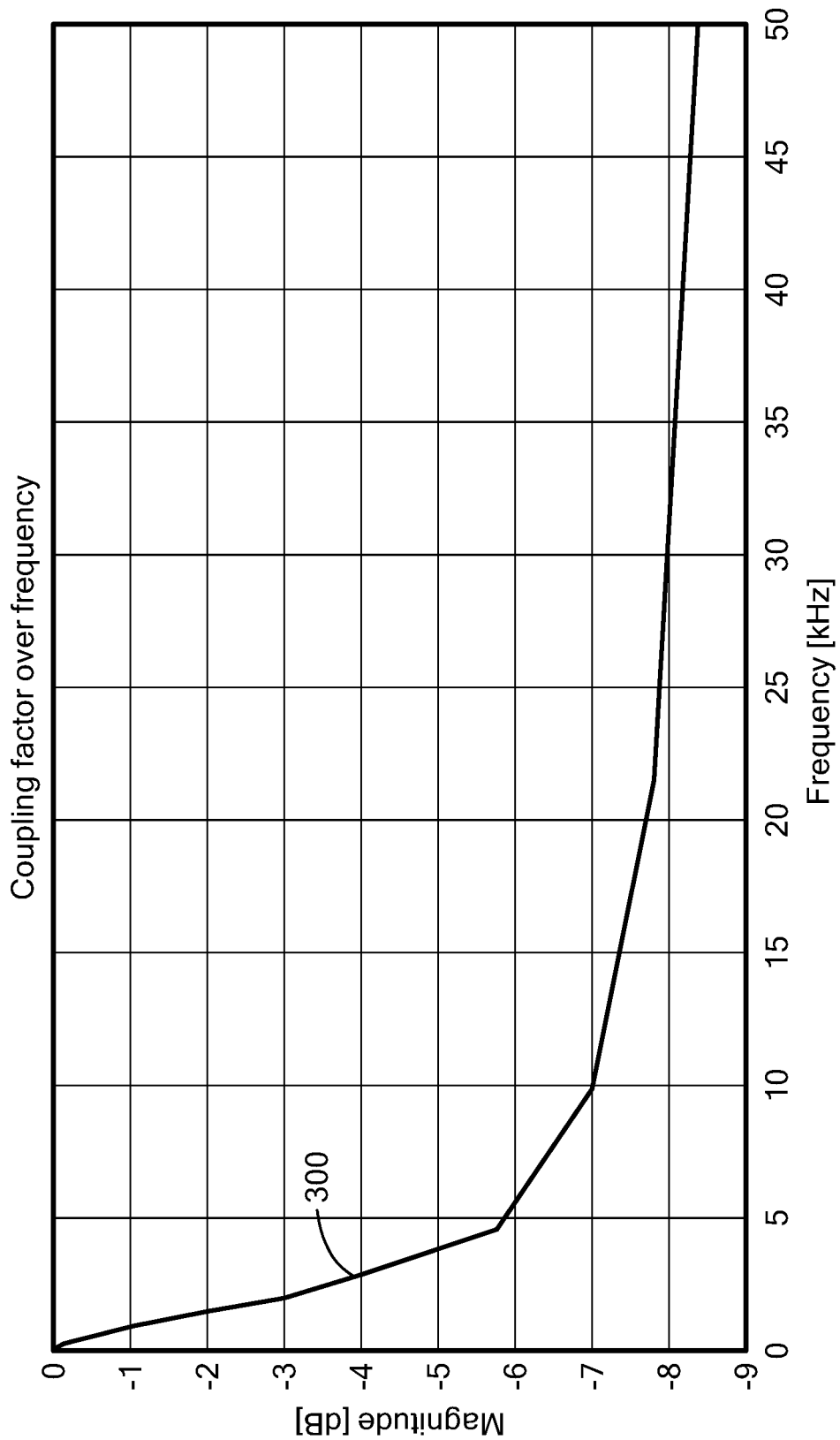
FIG. 3 is a graph illustrating a coupling factor between current and magnetic field over frequency for an example current sensor with the coupling factor shown in magnitude.

Referring also to FIG. 3, a characterization of the coupling factor α 14 for an example rectangular bus bar conductor is shown in a plot 300 having a horizontal axis representing the frequency of the current I with a scale in units of Hertz and a vertical axis representing the coupling factor magnitude in decibels. With knowledge of the coupling factor characterization 300, filter 84 can be designed to have an opposite, or inverse transfer function so as to "cancel" the effects of the coupling factor transfer function. More particularly, the transfer function of the characterized coupling factor as shown in FIG. 3 can be used to determine an optimized filter type, order and coefficients to provide an inverse transfer function.

From the coupling factor variation over frequency (e.g., as shown in FIG. 3), a corresponding transfer function can be estimated. For example, a transfer function representing the coupling factor plot 300 (i.e., a fitted transfer function) can have two poles and two zeros according to the following equation:

$$H_{CF}(s) = \frac{As^2 - Bs - C}{Ds^2 - Es - F} \quad (6)$$

where s is the Laplace variable: s=jω=j*2π*f, ω is the angular frequency and j the imaginary number. Depending on the application, the transfer function, number of poles and zeros can be changed to achieve the desired performance.

Equation (7) shows simplified fitted transfer function corresponding to the coupling factor variation over frequency of FIG. 3:

$$H_{CF}(s) = \frac{0.4s^2 - 4.69e6}{s^2 - 4.69e6}. \quad (7)$$

From the coupling factor transfer function in equation (7), the inverted transfer function (i.e., the transfer function suitable to inversely fit the coupling factor characterization 300 of FIG. 3) can be represented by equation (9) and used to design the compensation filter 84:

$$H_{Filter}(s) = \frac{s^2 - 4.69e6}{0.4s^2 - 4.69e6}. \quad (8)$$

By applying the filtering the magnetic field signal 18 with the filter 84 having the transfer function of equation (8), the sensor output signal 90 can be expressed as follows:

$$V_{OUT}(I) = G \cdot H_{CF}(s) \cdot H_{Filter}(s) \cdot \alpha(0) \cdot I = G \cdot \alpha(0) \cdot I \quad (9)$$

where G represents the gain of the sensor signal path.

As will be appreciated from consideration of equation (9), the resulting sensor output signal $V_{OUT}$ 90 is independent of the current frequency, as is desired. Thus, by determining the transfer function of the coupling factor and applying a filter having an inverse transfer function, dependence of the sensor output signal 90 on the frequency of the current can be eliminated. It will be appreciated that since coupling factor variations over frequency depend on factors such as the conductor design and sensor placement, the coupling factor transfer function (e.g., equation 8) and thus, also the inverted transfer function (e.g., equation 8) will vary according to the application.

Figure 3A:
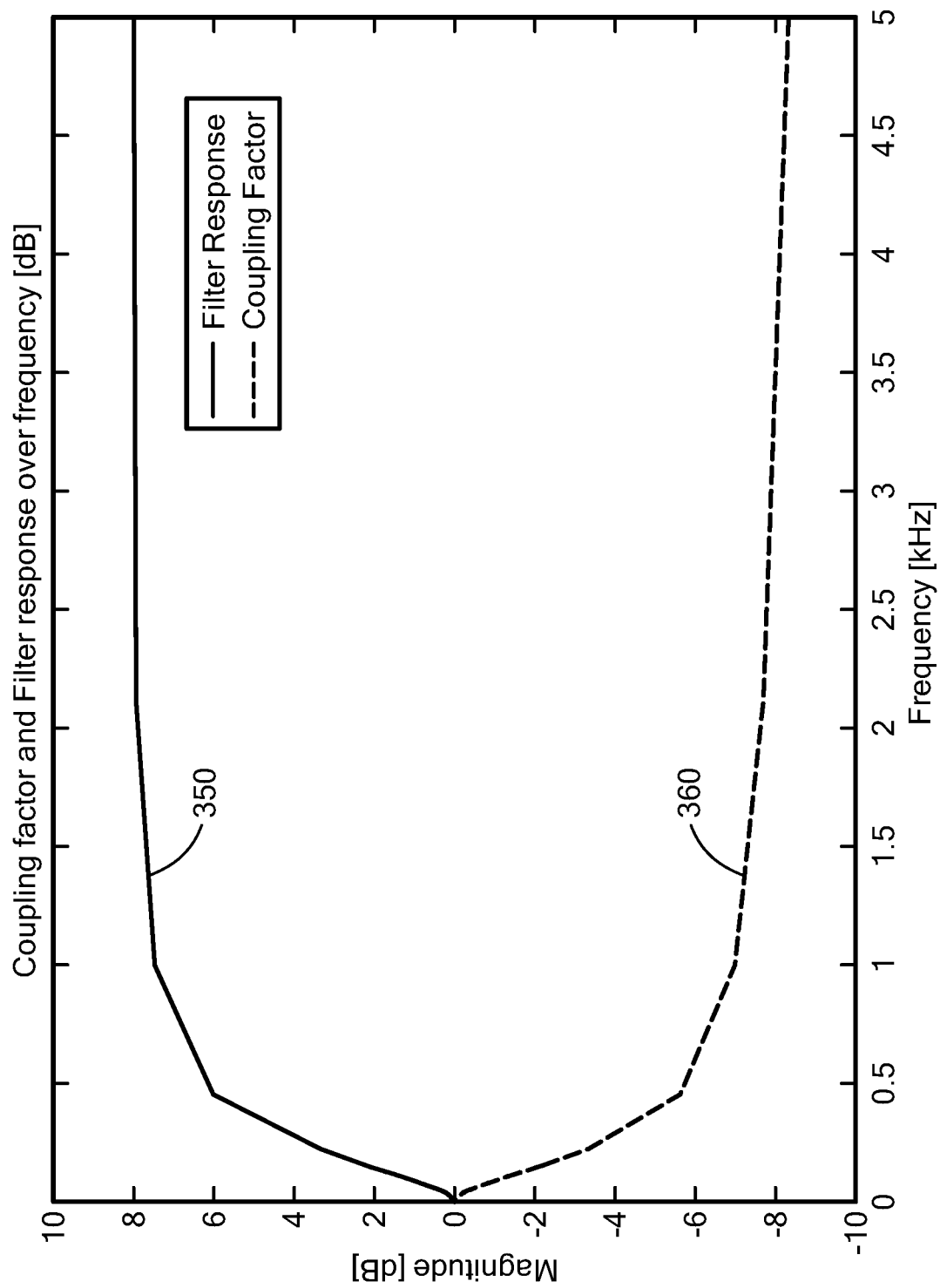
FIG. 3A is a graph illustrating a compensation factor for the example current sensor characterized by FIG. 3.

Referring also to FIG. 3A a coupling factor over frequency for an example current sensor system is shown in a plot 360 (that may be the same as or similar to plot 300 of FIG. 3) having a horizontal axis representing the frequency of the current I with a scale in units of Hertz and a vertical axis representing the coupling factor magnitude in decibels. Also shown in FIG. 3A is a transfer function 350 for a filter (e.g., filter 84) having an inverse relationship with respect to the coupling factor 360 and thus, suitable to cancel the current frequency effects when applied to the magnetic field signal.

Figure 3B:
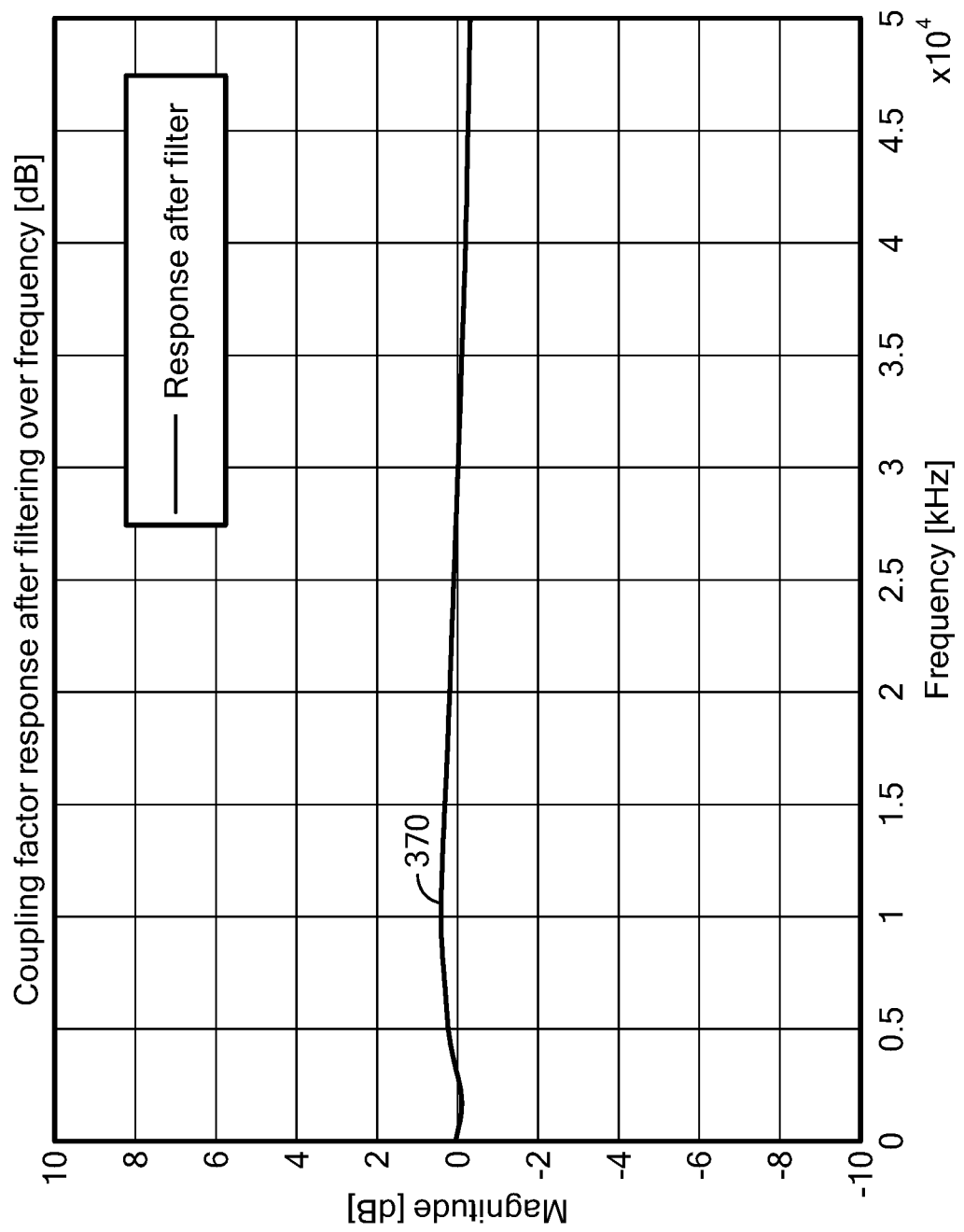
FIG. 3B is a graph illustrating a response to application of the compensation factor of FIG. 3A to the current sensor characterized by FIG. 3.

Referring to FIG. 3B, the result of the above-described filtering of the magnetic field signal is shown in a plot 370 having a horizontal axis representing the frequency of the current I with a scale in units of Hertz and a vertical axis representing the coupling factor magnitude in decibels. This plot 370 thus represents the current sensor output gain over frequency. As will be appreciated by consideration of FIG. 3A, the attenuation of the coupling factor over frequency is almost entirely compensated by the above-described filtering.

Figure 4:
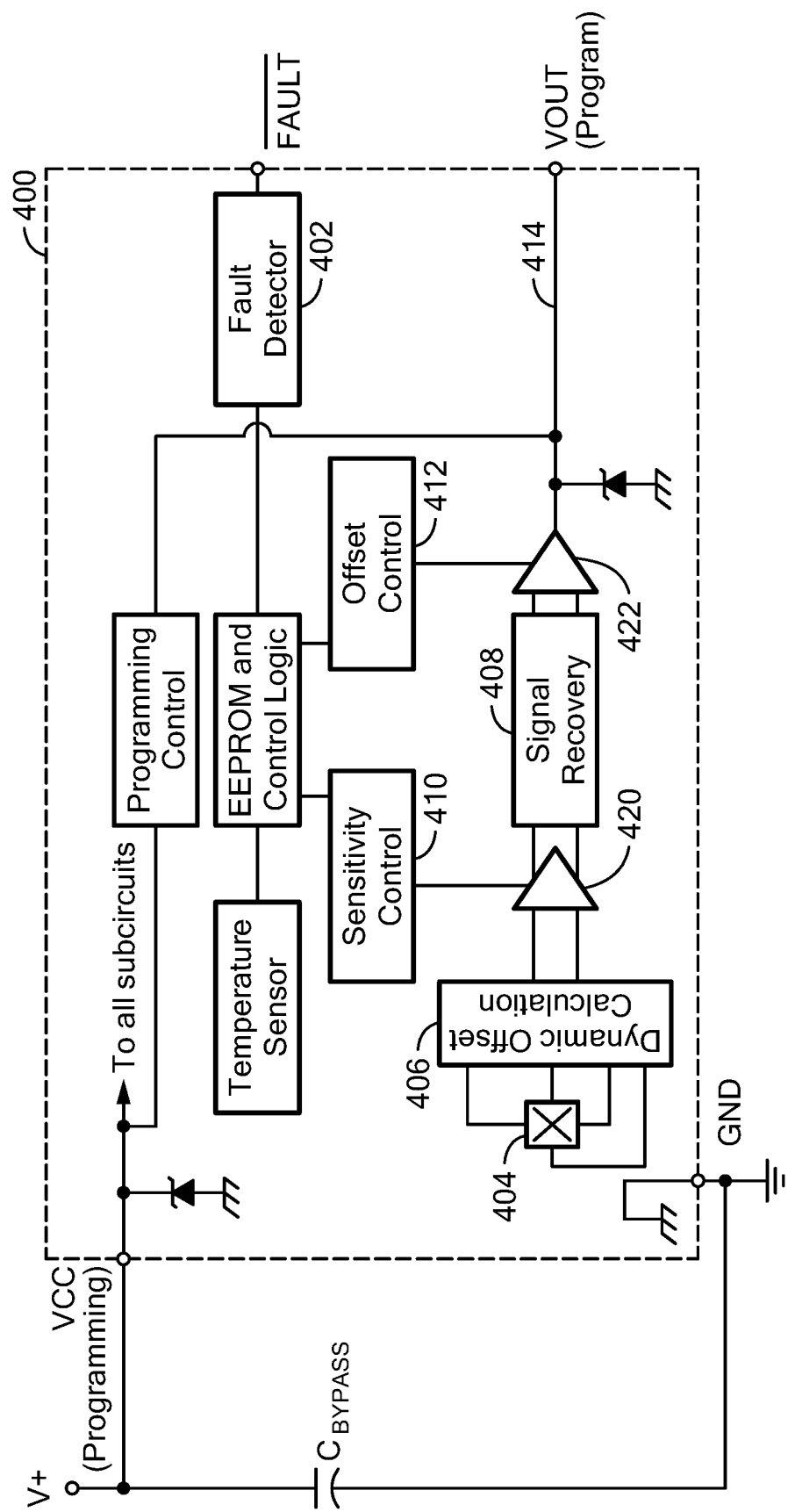
FIG. 4 is a block diagram of an example current sensor.

Referring to FIG. 4, an example current sensor 400 as may implement the above-described frequency effect compensation (i.e., as may provide the current sensor 12 of FIG. 1, 52 of FIG. 1A, or 80 of FIG. 1B) illustrates possible current sensor features. Current sensor 400 is a programmable linear sensor having a fault detection module 402. The current sensor 400 has an analog output voltage VOUT 414 that is proportional to a sensed magnetic field, as may be generated by a current through a conductor (not shown in FIG. 4) external to the sensor 400. Sensor 400 can be provided in the form of an integrated circuit and includes a magnetic field sensing element, such as a Hall element 404, to sense the magnetic field. A dynamic offset cancellation module 406 can be used in conjunction with a signal recovery module 408 to chop and then recover the magnetic field signal information in order to thereby reduce offset that can be associated with the magnetic field sensing element 404 for example. Sensitivity control 410 and and offset control 412 can be used (with respective amplifiers 420, 422) to further adjust the magnetic field signal, as described for example, in U.S. Pat. No. 7,923,996, which is incorporated herein by reference.

It will be appreciated that the above-described current frequency compensation can be implemented by introducing the compensation factor through a gain of amplifier 420 and/or 422. In other words, amplifier 420 and/or 422 can provide the gain element 60 of FIG. 1A. Alternatively, an additional filter can be used to implement the inverse frequency response associated with a characterized coupling factor as described above in connection with FIGS. 1B, 3, 3A, and 3B. The result is a current sensor output signal 414 that is substantially independent of a frequency of the sensed conductor current.

Figure 5:
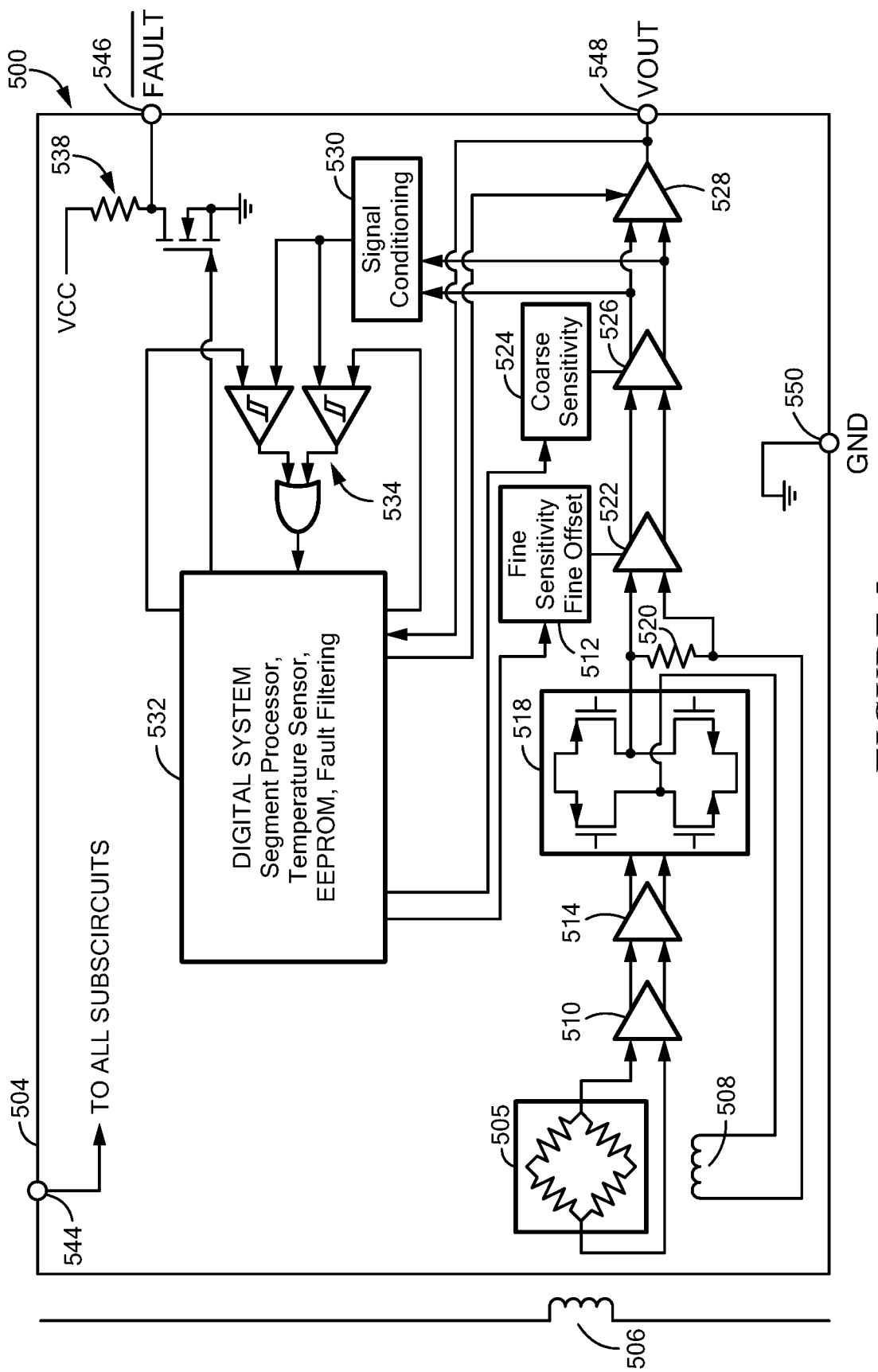
FIG. 5 is a block diagram of another example current sensor.

Referring also to FIG. 5, another example current sensor system 500 includes a current sensor 504 as may implement the above-described frequency effect compensation (i.e., as may provide the current sensor 12 of FIG. 1, 52 of FIG. 1A, or 80 of FIG. 1B) illustrates possible current sensor features. The current sensor 500 provides an output voltage VOUT 548 that is proportional to a sensed magnetic field, as may be generated by a current through a conductor 506 and thus, that is indicative of the current through the conductor. In embodiments, current sensor 500 can be provided in the form of an integrated circuit and the conductor 506 can be internal to the integrated circuit package or can be external to the package.

Current sensor 504 includes a magnetic field sensing element 505 and a controller circuit 532. Controller circuit 532 can generate various control signals to control processing the output signal received from magnetic field sensing element 505. For example, controller circuit 532 can provide linearly interpolated temperature compensation, and provide greater accuracy in sensitivity and offset voltage trimming and zero drift temperature drift to reduce a total error of current sensor 504 across the respective operating temperature range.

Controller circuit 532 can include or be coupled to a fine sensitivity and offset trim circuit 512 and a coarse sensitivity trim circuit 524. Each of the circuits 512, 524 can be controlled to modify an output of current sensor 504 to generate an output signal having high accuracy and compensate for changes in sensor performance due to temperature and other factors. For example, controller circuit 532 can be configured to provide temperature compensation within a predetermined accuracy threshold across the temperature operating range of the current sensor 504. Further, controller circuit 532 can reduce the sensitivity and offset drift of the magnetic field sensing element 505.

In the example current sensor 504, magnetic field sensing element 505 is provided as a magnetoresistance element having four resistive elements in a bridge configuration, such as a Wheatstone bridge. For example, magnetoresistance elements 505 may be coupled such that each leg of the bridge includes two elements positioned adjacent to one another, with one such leg spaced from the other leg. With this arrangement, a differential output signal of the bridge (taken between intermediate nodes of each bridge leg) is indicative of the difference between the magnetic field sensed by each bridge leg and results in a differential signal that rejects stray fields from sources other than the current through the conductor 506. The current sensor 504 can have a voltage source terminal 544 and ground terminal 550 through which power can be supplied to the sensor.

More generally, this configuration provides at least one first magnetic field sensing element spaced from at least one second magnetic field sensing element, wherein the at least one first magnetic field sensing element generates at least one first magnetic field signal indicative of a distance between the at least one first magnetic field sensing element and the conductor 506 and the at least one second magnetic field sensing element generates at least one second magnetic field signal indicative of a distance between the at least one second magnetic field sensing element and the conductor. The current sensor circuitry generates a difference signal indicative of a difference between the at least one first magnetic field signal and the at least one second magnetic field signal, which difference signal is indicative of the magnitude of the current.

Magnetic field sensing element 505 can generate a magnetic field signal and provide the magnetic field signal to a first amplifier 510 for further coupling to a second amplifier 514. One or more outputs of second amplifier 514 are coupled to differential amplifier circuit 518. Differential amplifier circuit 518 can include multiple field effect transistors coupled together to compare two input signals and remove or reduce noise and/or interference (e.g., DC offset) and in some embodiments, apply a gain to the difference between the two input signals.

Differential amplifier circuit 518 can be coupled to an inductive feedback element 508 and to a sense element 520. The inductive feedback element (i.e., a feedback conductor) 508 can be positioned proximate to magnetic field sensing element 505 in order to apply an equal and opposite field (i.e., a feedback field) to the sensing element 505 to thereby implement a closed loop current sensing system. More particularly, with the sense resistor 520, the feedback current can be sensed and used to generate the sensor output signal 548 that is indicative of the magnitude of the current through conductor 506.

An output of differential amplifier circuit 518 is coupled to a third amplifier 522. Fine sensitivity and offset trim circuit 512 can be coupled to third amplifier 522. Fine sensitivity and offset trim circuit 512 can generate and provide a sensitivity trim signal to third amplifier 522 to adjust a sensitivity and/or an offset voltage of third amplifier 522. One or more outputs of third amplifier 522 can be coupled to one or more inputs of a fourth amplifier 526.

Coarse sensitivity trim circuit 524 can be coupled to fourth amplifier 526. Coarse sensitivity trim circuit 524 can generate and provide a coarse sensitivity trim signal to fourth amplifier 526 to adjust a sensitivity of fourth amplifier 526. In embodiments, sensitivity and offset trim can be user programmable.

An output of the fourth amplifier 526 can be coupled to a signal conditioning circuit 530, as shown, in order to generate a fault output signal of the sensor and also to a fifth amplifier 528. More particularly, once conditioned, the signal can be compared to threshold voltages by a window comparison circuit 534. The result of the window comparison can be provided to the controller 532 and an over current fault output signal can be generated and provided to a fault terminal 546 (e.g., FAULT pin) of current sensor 504 through an output driver 538. In embodiments, independent positive and negative over current fault thresholds can be user programmed. An output of fifth amplifier 528 can be coupled to an output terminal 548 of current sensor circuit 504 (e.g., VOUT).

It will be appreciated that the above-described current frequency compensation can be implemented by introducing the compensation factor through a gain of one or more of the signal path amplifiers 510, 514, 522, 526, 528. In other words, one or more of these amplifiers can provide the gain element 60 of FIG. 1A. Alternatively, an additional filter can be used to implement the inverse frequency response associated with a characterized coupling factor as described above in connection with FIGS. 1B, 3, 3A, and 3B. The result is a current sensor output signal 548 that is substantially independent of a frequency of the sensed conductor current.

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

All references cited herein are hereby incorporated herein by reference in their entirety.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

Having described preferred embodiments, it will now become apparent to one of ordinary skill in the art that other embodiments incorporating their concepts may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A current sensor comprising:
one or more magnetic field sensing elements configured to generate a magnetic field signal indicative of a magnitude of a sensed magnetic field, wherein the sensed magnetic field is related to a frequency of a current through a conductor and is related to a magnitude of the current by a coupling factor; and
a signal path responsive to the magnetic field signal and comprising a compensator configured to apply a compensation factor to the magnetic field signal to generate a sensor output signal indicative of the magnitude of the current and substantially independent of a frequency of the current, wherein the signal path is responsive to a characterization of the coupling factor over a range of frequencies of the current in order to determine the compensation factor to be applied.

2. The current sensor of claim 1, wherein the characterization of the coupling factor is generated based on one or both of simulating operation of the current sensor or testing of the current sensor.

3. The current sensor of claim 1, further comprising a frequency measurement circuit to measure the frequency of the current.

4. The current sensor of claim 3, further comprising a look-up table in which the characterization of the coupling factor is stored.

5. The current sensor of claim 4, wherein the signal path comprises a processor and wherein compensation factor is determined by the processor using the look-up table in response to the measured frequency of the current.

6. The current sensor of claim 3, further comprising a memory configured to store an approximating function of the characterization of the coupling factor.

7. The current sensor of claim 6, wherein the signal path comprises a processor and wherein compensation factor is determined by the processor computing the approximating function in response to the measured frequency.

8. The current sensor of claim 1, wherein the coupling factor comprises a transfer function and wherein signal path comprises a filter having an inverse frequency response with respect to the transfer function of the coupling factor.

9. The current sensor of claim 1, wherein the one or more magnetic field sensing elements and the signal path are integrated into a package and wherein conductor is integrated into the same package.

10. The current sensor of claim 1, the one or more magnetic field sensing elements and the signal path are integrated into a package and wherein conductor is external to the package.

11. The current sensor of claim 1, wherein the one or more magnetic field sensing elements comprise one or more of magnetoresistance elements or Hall effect elements or fluxgate element.

12. The current sensor of claim 11, wherein the one or more magnetoresistance elements comprises at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

13. The current sensor of claim 1, wherein at least one first magnetic field sensing element is spaced from at least one second magnetic field sensing element, wherein the at least one first magnetic field sensing element is configured to generate at least one first magnetic field signal indicative of a distance between the at least one first magnetic field sensing element and the conductor and wherein the at least one second magnetic field sensing element is configured to generate at least one second magnetic field signal indicative of a distance between the at least one second magnetic field sensing element and the conductor and wherein the signal path comprises a circuit responsive to the at least one first magnetic field signal and to the at least one second magnetic field signal and configured to generate a difference signal indicative of a difference between the at least one first magnetic field signal and the at least one second magnetic field signal, wherein the difference is indicative of the magnitude of the current and substantially independent of the frequency of the current.

14. A method for sensing a current through a conductor, comprising:
generating a magnetic field signal in response to a magnetic field associated with the current, wherein the magnetic field is related to the magnitude of the current by a coupling factor;
applying a compensation factor to the magnetic field signal to generate a sensor output signal indicative of the magnitude of the current and substantially independent of a frequency of the current;
characterizing the coupling factor over a range of frequencies of the current; and
determining the compensation factor based on the characterization of the coupling factor.

15. The method of claim 14, further comprising measuring a frequency of the current and using the measured frequency to determine the compensation factor to be applied to the magnetic field signal.

16. The method of claim 14, wherein the coupling factor comprises a transfer function and wherein applying the compensation factor to the magnetic field signal comprises filtering the magnetic field signal with a filter having an inverse transfer function with respect to the transfer function of the coupling factor.

17. A current sensor comprising:
means for sensing a magnetic field generated by a current through a conductor and generating a magnetic field signal related to a magnitude and frequency of the current, wherein the sensed magnetic field is related to the magnitude of the current by a coupling factor;
means for applying a compensation factor to the magnetic field signal to generate a sensor output signal indicative of the magnitude of the current and substantially independent of a frequency of the current; and
means for characterizing the coupling factor over a range of frequencies of the current in order to determine the compensation factor.

18. The current sensor of claim 17, further comprising means for measuring the frequency of the current and using the measured frequency to determine the compensation factor.

19. The current sensor of claim 17, wherein the coupling factor has a transfer function and wherein the compensation factor applying means comprises a filter having a transfer function inversely related to the transfer function of the coupling factor.

20. A current sensor comprising:
one or more magnetic field sensing elements configured to generate a magnetic field signal indicative of a magnitude of a sensed magnetic field, wherein the sensed magnetic field is related to a magnitude and frequency of a current through a conductor; and
a signal path responsive to the magnetic field signal and comprising a compensator configured to apply a compensation factor to the magnetic field signal to generate a sensor output signal indicative of the magnitude of the current and substantially independent of a frequency of the current, wherein at least one first magnetic field sensing element is spaced from at least one second magnetic field sensing element, wherein the at least one first magnetic field sensing element is configured to generate at least one first magnetic field signal indicative of a distance between the at least one first magnetic field sensing element and the conductor and wherein the at least one second magnetic field sensing element is configured to generate at least one second magnetic field signal indicative of a distance between the at least one second magnetic field sensing element and the conductor and wherein the signal path comprises a circuit responsive to the at least one first magnetic field signal and to the at least one second magnetic field signal and configured to generate a difference signal indicative of a difference between the at least one first magnetic field signal and the at least one second magnetic field signal, wherein the difference is indicative of the magnitude of the current and substantially independent of the frequency of the current.

21. The current sensor of claim 20, wherein the sensed magnetic field is related to the magnitude of the current by a coupling factor and wherein the signal path is responsive to a characterization of the coupling factor over a range of frequencies of the current in order to determine the compensation factor to be applied.

22. The current sensor of claim 21, wherein the characterization of the coupling factor is generated based on one or both of simulating operation of the current sensor or testing of the current sensor.

23. The current sensor of claim 21, further comprising a frequency measurement circuit to measure the frequency of the current.

* * * * *

UNITED STATES PATENT AND TRADEMARK OFFICE
CERTIFICATE OF CORRECTION

| | |
|---|---|
| PATENT NO. | : 11,047,928 B2 |
| APPLICATION NO. | : 16/511101 |
| DATED | : June 29, 2021 |
| INVENTOR(S) | : Yannick Vuillermet et al. |

It is certified that error appears in the above-identified patent and that said Letters Patent is hereby corrected as shown below:

In the Specification

Column 5, Line 8 delete "a varies" and replace with --α varies--.

Column 5, Line 46 delete "based a" and replace with --based on a--.

Column 6, Line 65 delete "a over" and replace with --α over--.

Column 7, Line 29 delete "a over" and replace with --α over--.

Column 8, Line 47 delete "filtering the" and replace with --filtering to the--.

Column 9, Line 36 delete "and and" and replace with --and--.

Column 10, Lines 23-24 delete ", magnetoresistance elements 505" and replace with --, magnetic field sensing element 505--.

Signed and Sealed this
Twenty-first Day of June, 2022

*Katherine Kelly Vidal*

Katherine Kelly Vidal
*Director of the United States Patent and Trademark Office*